(12) United States Patent
Iwasaki (10) Patent No.: US 10,918,000 B2
(45) Date of Patent: Feb. 9, 2021

(54) COMPONENT SUPPLY DEVICE

(71) Applicant: FUJI CORPORATION, Chiryu (JP)

(72) Inventor: Masataka Iwasaki, Anjyo (JP)

(73) Assignee: FUJI CORPORATION, Chiryu (JP)

( * ) Notice: Subject to any disclaimer, the term of this patent is extended or adjusted under 35 U.S.C. 154(b) by 297 days.

(21) Appl. No.: 15/752,337

(22) PCT Filed: Sep. 9, 2015

(86) PCT No.: PCT/JP2015/075554
§ 371 (c)(1),
(2) Date: Feb. 13, 2018

(87) PCT Pub. No.: WO2017/042901
PCT Pub. Date: Mar. 16, 2017

(65) Prior Publication Data
US 2019/0269049 A1 Aug. 29, 2019

(51) Int. Cl.
*B23P 19/00* (2006.01)
*H05K 13/04* (2006.01)
(Continued)

(52) U.S. Cl.
CPC ......... *H05K 13/0419* (2018.08); *H05K 13/02* (2013.01); *H05K 13/0417* (2013.01); *H05K 13/086* (2018.08)

(58) Field of Classification Search
CPC .. H05K 13/0419; H05K 13/02; H05K 13/086; H05K 13/0417
See application file for complete search history.

(56) References Cited

U.S. PATENT DOCUMENTS 2,047,769 A * 7/1936 Cullen ................. B65H 19/126
242/559.4
5,588,614 A * 12/1996 Takada ................. B65H 37/002
242/538.2
(Continued)

FOREIGN PATENT DOCUMENTS

JP 2011-138834 A 7/2011
JP 2012-248784 A 12/2012
(Continued)

OTHER PUBLICATIONS

International Search Report dated Dec. 8, 2015 in PCT/JP2015/075554 filed Sep. 9, 2015.

*Primary Examiner* — Paul D Kim
(74) *Attorney, Agent, or Firm* — Oblon, McClelland, Maier & Neustadt, L.L.P.

(57) ABSTRACT

An additional type reel holding device configured to be attached to a component supply device provided on a component mounter, the component supply device including multiple feeder devices and a standard reel holding section configured to hold multiple tape reels in a rotatable and exchangeable manner. The additional type reel holding device is attached as an addition to the standard reel holding section, holds additional tape reels different to the tape reels held by the standard reel holding section in a rotatable and exchangeable manner, and supplies the carrier tapes wound on the additional tape reels to the feeder devices. Thus, it is possible to increase the overall quantity of carrier tapes supplied to feeder devices from the standard reel holding section and the additional type reel holding device.

7 Claims, 5 Drawing Sheets

(51) Int. Cl.
*H05K 13/02* (2006.01)
*H05K 13/08* (2006.01)

(56) References Cited

U.S. PATENT DOCUMENTS

| | | | |
|---|---|---|---|
| 9,137,936 B2* | 9/2015 | Katsumi | H05K 13/0417 |
| 9,957,126 B2* | 5/2018 | Ohashi | H05K 13/0215 |
| 10,271,469 B2* | 4/2019 | Tanokuchi | H05K 13/021 |
| 2018/0046736 A1* | 2/2018 | Sugimoto | G06Q 50/04 |
| 2018/0242482 A1* | 8/2018 | Kunihiro | H05K 13/0417 |
| 2018/0310445 A1* | 10/2018 | Taniguchi | H05K 13/0419 |

FOREIGN PATENT DOCUMENTS

| | | |
|---|---|---|
| JP | 2013-46024 A | 3/2013 |
| JP | 2015-53309 A | 3/2015 |
| WO | WO 2013/136423 A1 | 9/2013 |

* cited by examiner

COMPONENT SUPPLY DEVICE

TECHNICAL FIELD

The present application relates to an additional type reel holding device that is removably added to a component supply device provided on a component mounter.

BACKGROUND ART

Equipment such as solder printers, component mounters, reflow ovens, and board inspection machines is used to produce boards mounted with many components. Conventionally, this equipment is connected to form a board production line. Among this equipment, there are component mounters provided with a board conveyance device, a component supply device, a component transfer device, and a control device. Many component supply devices are configured such that multiple feeder devices, which feed carrier tape in which cavities holding components are formed in a line, are lined up in a row. Conventionally, feeder devices are provided with an integrated reel holding section that holds a tape reel around which carrier tape is wound, or are provided with a reel holding section as a separate body. Examples of technology related to this kind of component supply device and feeder device are disclosed in patent literature 1 to 3.

An electronic component supply device of patent literature 1 includes multiple tape feeders (feeder devices) and a feeder holding device that holds the feeders. The multiple tape feeders can be divided into a first section that includes a component supply section and a guide section for taped components (carrier tape), and a second section that includes a taped components feeding device. Further, the multiple tape feeders are held in the feeder holding device in a state with each component supply section lined up in multiple rows. Accordingly, it is possible to increase the quantity of tape feeders that can be loaded.

Meanwhile, a component supply device of patent literature 2 includes a reel holding section that holds reels on which is wound component supply tape, and a supply device main body section provided with a component supply tape indexing device. The reel holding section is attached to the supply device main body section, and is movable to a component supply position and a reel attachment and removal position. Accordingly, it is possible to line up multiple reel holding sections close to each other, such that a component supply system including multiple supply devices can be made compact.

Further, patent literature 3 discloses a reel holding tool to be attached to a component supply section of a component mounter. This reel holding tool includes a first and a second reel holding section that hold a reel on which is wound carrier tape, and two reel holding sections are arranged in a line in the tape feeding direction. Accordingly, multiple reels can be held, in particular a first reel and a second reel can be held, at a feeder that performs automatic supply without splicing, thus achieving good usability.

CITATION LIST

Patent Literature

Patent literature 1: JP-A-2011-138834
Patent literature 2: JP-A-2013-46024
Patent literature 3: JP-A-2015-53309

SUMMARY

Technical Problem

However, with the technology of patent literature 1 to 3, the quantity of feeder devices is increased to increase the types of components that can be supplied, and two tape reels are used in one feeder device such that splicing work can be omitted. When using such new type feeder devices in a component supply device, it is necessary to hold many more tape reels than before and to increase the quantity of carrier tapes being supplied. However, with the technology of patent literature 1 to 3, it is necessary to manufacture a new reel holding section that matches the new type feeder device, and to create a configuration in which the entire set of feeder devices and reel holding sections can be exchanged in one go. Thus, current reel holding sections are wasted and manufacturing costs are high.

Also, there are also many cases in which feeder devices have compatibility with each other such that they can be set in rows on a component supply device regardless of the type or construction. However, with the technology of patent literature 1 to 3, because it is necessary to have a fixed reel holding section for each feeder device, it is not possible to maintain compatibility for different types and constructions of feeder devices.

The present disclosure takes account of the above problems with conventional technology, and an object thereof is to provide an additional type reel holding device capable of increasing the quantity of carrier tapes that can be supplied to a feeder device in a case in which there is an insufficient quantity of carrier tapes being supplied from a standard reel holding section that is provided on a component supply device.

Solution to Problem

To solve the above problems, an additional type reel holding device of the present disclosure is configured to be attached to a component supply device provided on a component mounter, the component supply device including multiple feeder devices configured to sequentially supply multiple components by feeding carrier tape in which the multiple components are held and a standard reel holding section configured to hold multiple tape reels around which are wound the carrier tapes in a rotatable and exchangeable manner, wherein the additional type reel holding device is attached as an addition to the standard reel holding section, holds additional tape reels different to the tape reels held by the standard reel holding section in a rotatable and exchangeable manner, and supplies the carrier tapes wound on the additional tape reels to the feeder devices.

Advantageous Effects

An additional type reel holding device of the present disclosure, in a case in which a quantity of carrier tapes supplied from a standard reel holding section provided on a component supply device is insufficient, is attached as an addition to the component supply device, holds an additional tape reel, and supplies carrier tape from the additional tape reel to the feeder device. Thus, it is possible to increase the overall quantity of carrier tapes supplied to feeder devices from the standard reel holding section and the additional type reel holding device.

DESCRIPTION OF EMBODIMENTS

1. Overall Configuration of Component Mounter 1

Figure 1:
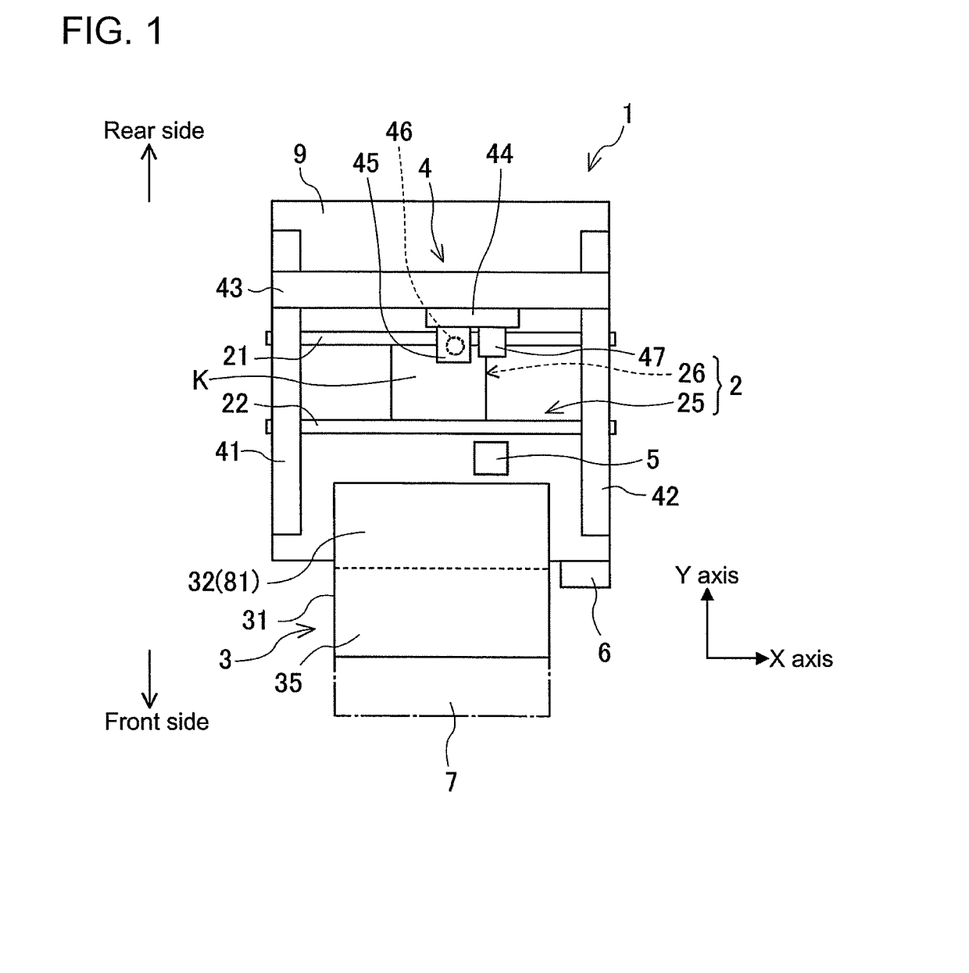
FIG. 1 is a plan view showing the overall configuration of a component mounter that uses an embodiment of an additional type reel holding device.

An embodiment of the present disclosure, additional type reel holding device 7, will be described with reference to FIGS. 1 to 5. First, the overall configuration of component mounter 1 that uses additional type reel holding device 7 will be described. FIG. 1 is a plan view showing the overall configuration of component mounter 1 that uses additional type reel holding device 7. The direction from the left side of the page to the right side in FIG. 1 is the X-axis direction, in which board K is conveyed, and the direction from the front at the bottom of the page to the rear at the top of the page is the Y-axis direction. Component mounter 1 is configured from items such as board conveyance device 2, component supply device 3, component transfer device 4, component camera 5, and control device 6 assembled on base 9. Board conveyance device 2, component supply device 3, component transfer device 4, and component camera 5 are controlled from control device 6 such that each performs specified work.

Board conveyance device 2 is configured from items such as board conveyance section 25 and backup section 26. Board conveyance section 25 is configured from items such as pair of guide rails 21 and 22, and a pair of conveyor belts, and conveys board K to a component mounting position. Backup section 26 is arranged below the mounting position and raises and positions board K.

Component supply device 3 is configured around feeder pallet 31. Feeder pallet 31 is detachably provided on the front side of base 9. Feeder pallet 31 includes feeder attachment section 32 on the rear side, and standard reel holding section 35 on the front side. Feeder attachment section 32 is formed such that multiple feeder devices 81 can be arranged in a row. Standard reel holding section 35 is formed to be able to hold multiple tape reels TR in a rotatable and exchangeable manner. Details of the configuration of feeder pallet 31 are described later. As shown by the single-dash broken line in FIG. 1, additional type reel holding device 7 of the present embodiment is attached as an addition to the front side of standard reel holding section 35.

Component transfer device 4 picks up components from the multiple feeder devices 81, transfers them to a positioned board K, and mounts the components. Component transfer device 4 is an XY robot type device that is capable of moving horizontally in the X-axis direction and the Y-axis direction. Component transfer device 4 is configured from pair of Y-axis rails 41 and 42 and Y-axis slider 43 that form a head driving mechanism, mounting head 44 that is driven in the X-axis direction and the Y-axis direction, nozzle tool 45, suction nozzle 46, board camera 47, and the like. Nozzle tool 45 is exchangeably held on mounting head 44, and holds suction nozzle 46 that picks up and mounts components on board K. Board camera 47 is provided on mounting head 44 and images position reference marks provided on board K to detect an accurate position of board K.

Component camera 5 is provided facing upwards on an upper surface of base 9 between board conveyance device 2 and feeder device 3. Component camera 5 images a state of a component picked up by suction nozzle 46 as the component is moved from feeder device 3 to above board K by mounting head 44. Control device 6 is assembled on base 9, but the arrangement position is not particularly restricted. Control device 6 controls component mounting work in accordance with a predetermined mounting sequence.

Figure 2:
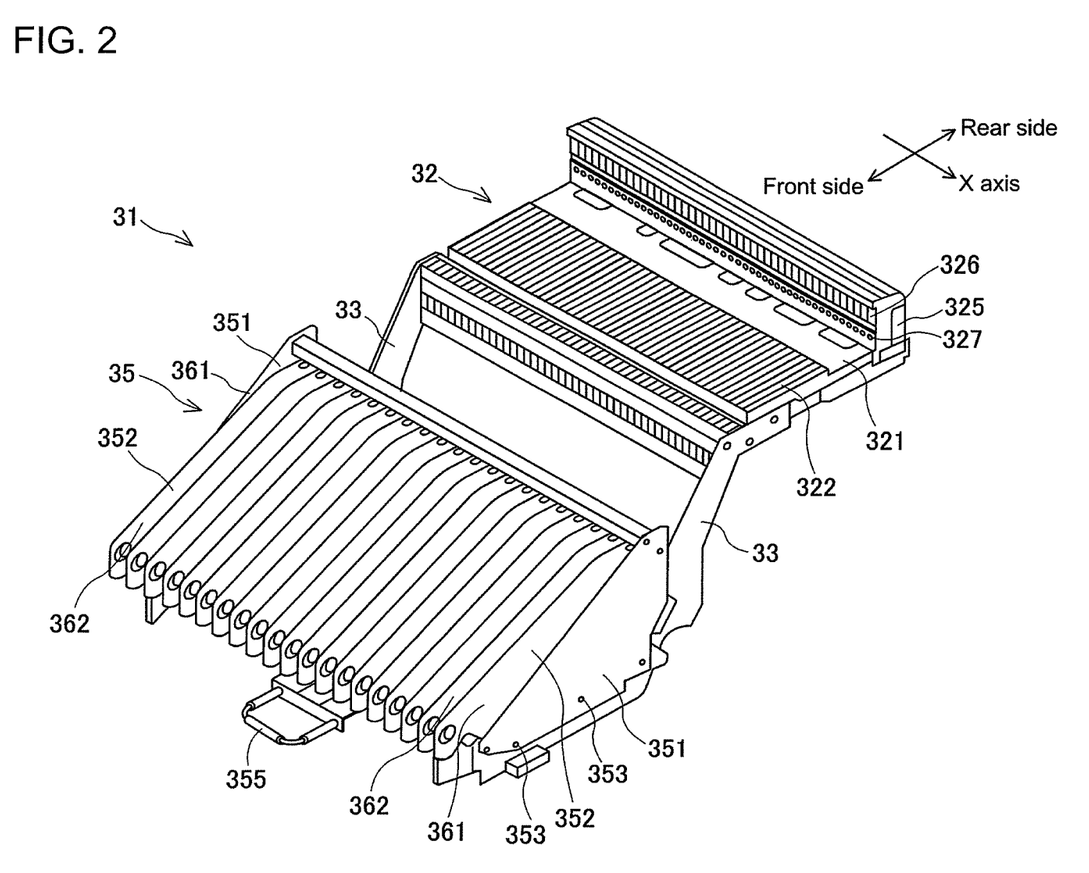
FIG. 2 is a perspective view of a feeder pallet that forms the base of a component supply device.

Details of the configuration of feeder pallet 31 are described next. FIG. 2 is a perspective view of feeder pallet 31 that forms the base of component supply device 3. Feeder pallet 31 includes feeder attachment section 32 on the rear side, and standard reel holding section 35 on the front side. Feeder attachment section 32 is formed such that upright section 325 is established at the rear end of substantially rectangular horizontal section 321. Slots 322 that extend in the front-rear direction (Y-axis direction) are lined up in the X-axis direction on horizontal section 321. In the present embodiment, forty slots 322 are provided. Pallet-side connectors 326 are provided on upright section 325 at positions corresponding to slots 322. Positioning holes 327 are provided at the top and bottom of each pallet-side connector 326 (in FIG. 2, the upper positioning holes cannot be seen).

Multiple feeder devices 81 are inserted from the front to the rear into each slot 322 so as to be attached lined up in the X-axis direction. Thus, multiple feeder devices 81 are arranged in a row in an arrangement direction, which is the X-axis direction. Positioning pins provided at the top and bottom of the rear surface of feeder device 81 are inserted into the upper and lower positioning holes 327. Thus, feeder device 81 is positioned with respect to feeder pallet 31. At the same time, a feeder-side connector provided between the upper and lower positioning pins of feeder device 81 is inserted into pallet-side connector 326. Thus, feeder device 81 is connected such that communication with control device 6 is possible and power is supplied.

Arm members 33 are fixed at both ends in the X-axis direction to the front side of horizontal section 321. The two arm members 33 are formed to extend horizontally at first, then to extend diagonally forward and down, and finally to extend horizontally again. The two arm members 33 protrude from the front of base 9 when component supply device 3 is attached. Standard reel holding section 35 is provided on the diagonal portion and the front horizontal portion of arm member 33. Standard reel holding section 35 is arranged lower than horizontal section 321 so as not to interfere with the loading and unloading of feeder devices 81. Handle 355 is provided on a lower side of standard reel holding section 35. The entire feeder pallet 31 is removed from base 9 by handle 355 being pulled.

Standard reel holding section 35 is provided as a separate body to feeder device 81. Standard reel holding section 35 is formed from items such as a bottom plate that cannot be seen in FIG. 2, two side plates 351, twenty dividing plates 352, and two shaft members 353. The two side plates 351 are approximately right-angled triangle shaped plates. A first side adjacent to the right angle of the plate extends in a front-rear direction, and a second side adjacent to the right angle extends in a vertical direction on the rear side, with the hypotenuse extending from the lower front section to the upper rear section. As shown in FIG. 2, the two rear plates 351 are arranged spaced apart horizontally by the same distance as the width dimension of feeder pallet 31, and are fixed to the bottom plate.

The twenty dividing plates 352 are long plates in the front-rear direction. These dividing plates 352 are arranged parallel to side plates 351, are equally spaced, and fixed to the bottom plate. Single reel storage sections 361 are demarcated by the dividing plates 352 at both ends and the two side plates 351. The two single reel storage sections 361 each exchangeably store one tape reel TR. Multiple reel storage sections 362 are demarcated by adjacent dividing plates 352. A total of nineteen multiple reel storage sections 362 each exchangeably store two tape reels TR lined up in the X-axis direction. Thus, the maximum quantity of tape reels TR stored by standard reel holding section 35 is forty, which is the same quantity as the quantity of slots 322.

Two round rod-shaped shaft members 353 connect the respective front sides of a lower section of the two side plates 351 and the respective rear sides of a lower section of the two side plates 351. The two parallel front and rear shaft members 353 each pass through shaft holes formed in each of the dividing plates 352. Two rollers each rotatably supported on the two front and rear shaft members 353 are arranged on the inside of single reel storage sections 361. The two front and rear rollers rotatably support the outer circumferential surface of tape reel TR. Two rollers each rotatably supported on the two front and rear shaft members 353 are arranged on the inside of single reel storage sections 361 lined up in the X-axis direction. From the total of four rollers, two at the front and rear form a set that rotatably supports the outer circumferential surface of tape reel TR.

By using two rollers arranged spaced apart in the front-rear direction for one tape reel TR, it is possible to rotatably and exchangeably support multiple types of tape reels TR with different diameters. However, the configuration is not limited to this, the outer circumference of one tape reel TR may be supported at three or more points. Also, the rollers may be omitted, and the outer circumferential surface of shaft members 353 can be given a slippery finish.

Conventional feeder device 81 is loaded on a single slot 322 and only requires a single tape reel TR. Thus, standard reel holding section 35 is sufficient for holding the tape reel TR. However, when a new type feeder device is loaded on component supply device 3, it may be necessary to hold a larger quantity of tape reels TR than with conventional feeder device 81.

For example, a feeder that performs automatic supply without splicing as in patent literature 3 (also referred to as auto loading feeder device 82) is loaded on a single slot 322, but requires two tape reels TR in order to eliminate splicing work. Also, a multiple feeder device (for example, refer to patent document JP4856761) that supplies components from two carrier tapes is also loaded on a single slot 322 and required two tape reels TR. Further, an integrated feeder device in which multiple tape feeders are integrated as one, as disclosed in patent literature 1, also requires a larger quantity of tape reels TR than the quantity of slots 322 occupied by the feeder.

2. Configuration and Attachment Method of Additional Type Reel Holding Device 7

Figure 3:
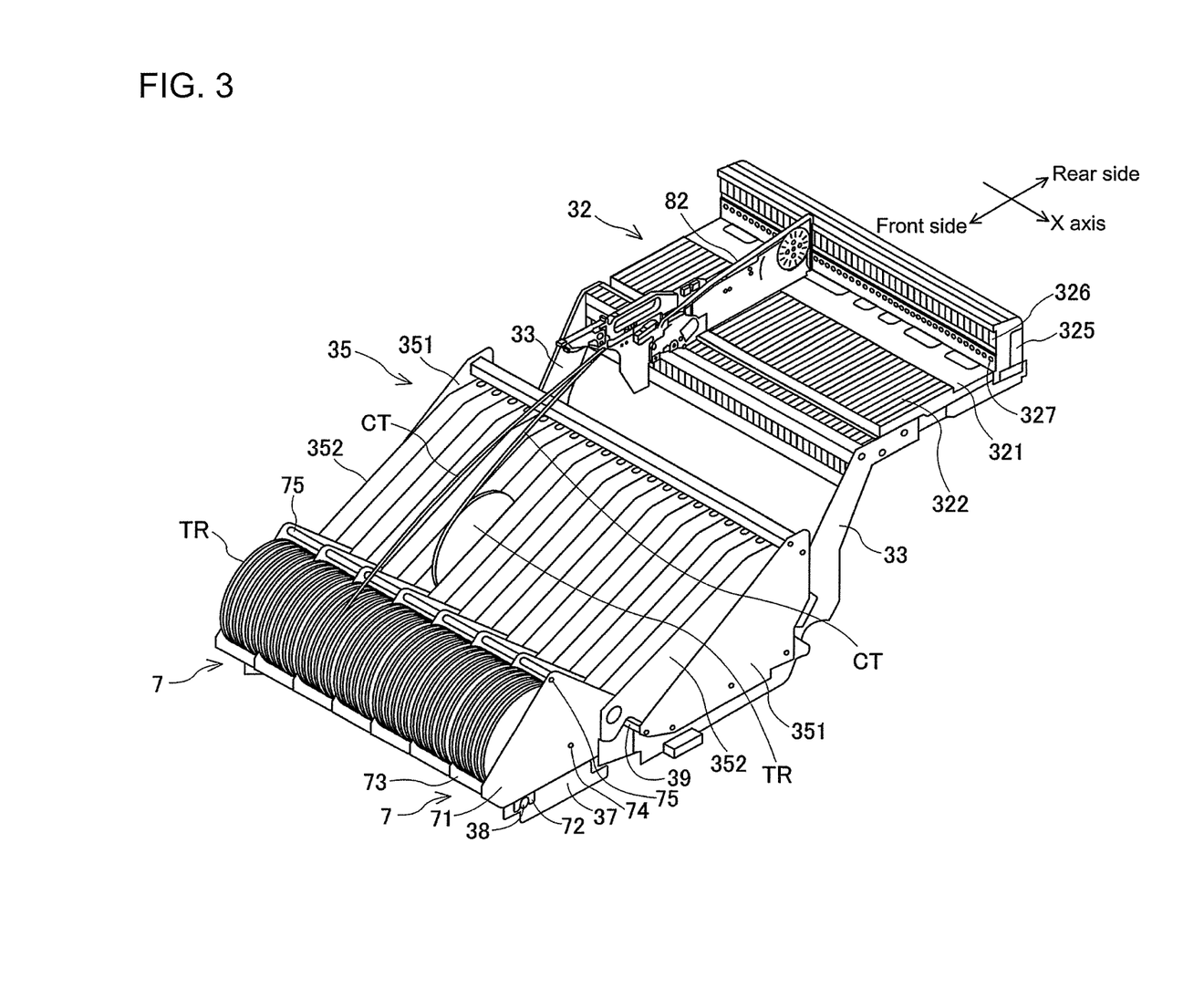
FIG. 3 is a perspective view with seven of the additional type reel holding devices attached as additions to the component supply device.
Figure 4:
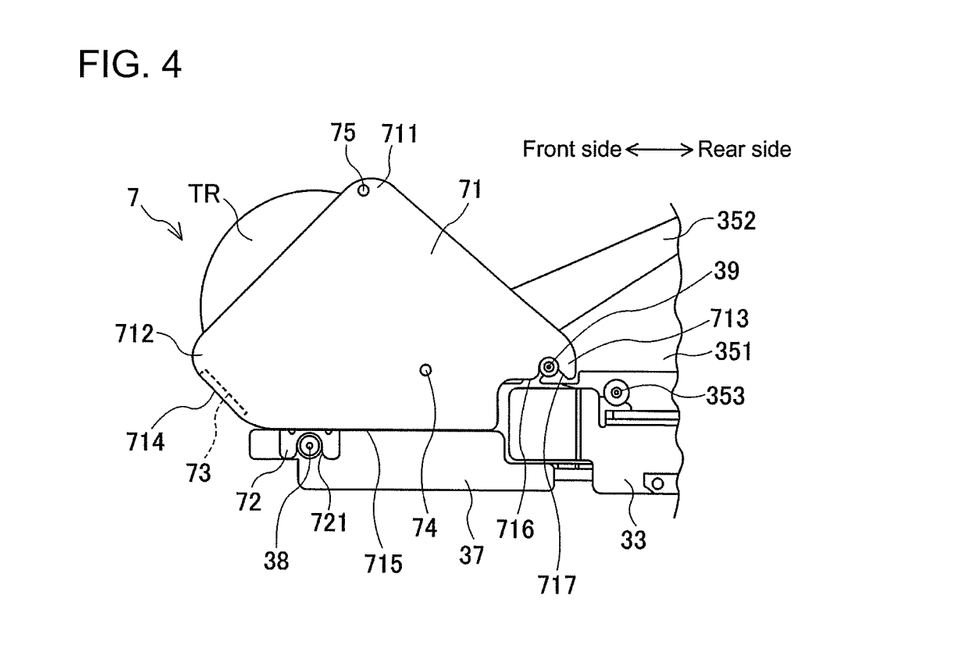
FIG. 4 is a side view illustrating the configuration and the attachment method of the additional type reel holding device.
Figure 5:
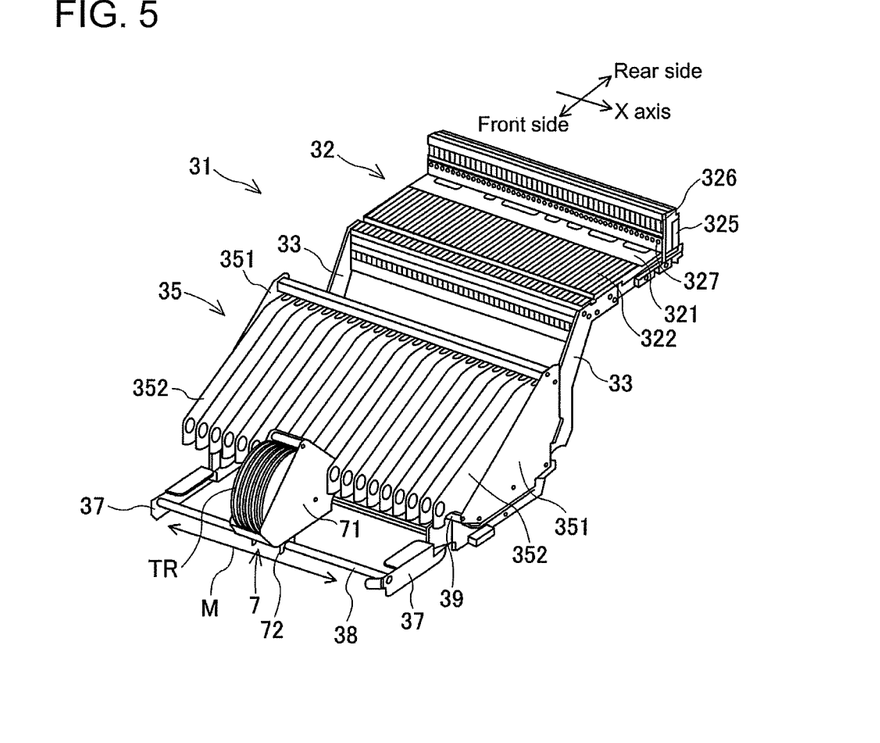
FIG. 5 is a perspective view with a single additional type reel holding device attached as an addition to the component supply device.

As described above, in a case in which it is necessary to increase the quantity of carrier tapes being supplied by holding a larger quantity of tape reels TR than with conventional methods, additional type reel holding device 7 is used. FIG. 3 is a perspective view with seven of the additional type reel holding devices 7 attached as additions to component supply device 3. In FIG. 3, a single auto loading feeder device 82 is shown as an example of a new type feeder device. In reality, many feeder devices 81 and 82 are loaded on feeder attachment section 32, and the many feeder devices 81 and 82 may be of different types and constructions. FIG. 4 is a side view illustrating the configuration and the attachment method of additional type reel holding device 7. FIG. 5 is a perspective view with one additional type reel holding device 7 attached as an addition to component supply device 3.

As shown in FIG. 3, additional type reel holding device 7 holds an additional five tape reels TR between two side plates 71. Additional type reel holding devices 7 are attached lined up on the front side of standard reel holding section 35. Additional type reel holding device 7 is configured from items such as two side plates 71, front lower plate 73, support shaft 74, and retainer shaft 75.

As shown in FIG. 4, the upper side of side plates 71 is formed into a mountain shape that slopes down from top section 711 to front end section 712 and to rear end section 713. The lower side of side plates 71 is formed from diagonal section 714, bottom section 715, and second bottom section 716 that are connected. Diagonal section 714 is formed sloping backwards and down from front end section 712. Bottom section 715 extends horizontally to the rear from the rear end of diagonal section 714. Second bottom section 716 extends upwards from the rear end of bottom section 715, and then extends horizontally to the rear side, meeting rear end section 713.

Front bottom plate 73 is arranged at an angle and connects diagonal sections 714 of the two side plates 71. Support shaft 74 connects positions on the two side plates 71 slightly higher than bottom section 715 and slightly to the rear of top section 711. Retainer shaft 75 connects positions on the two side plates 71 close to top section 711. The horizontal spacing of the two side plates 71 is maintained by front bottom plate 73, support shaft 74, and retainer shaft 75, such that a reel holding space is formed between the two side plates 71.

Support shaft 74 and retainer shaft 75 are round rods. Support shaft 74 and retainer shaft 75 may be provided with rollers similar to shaft member 353 of standard reel holding section 35, or rollers may be omitted. Five tape reels TR can be set in the reel holding space between front bottom plate 73 and retainer shaft 75. Front bottom plate 73 and support shaft 74 arranged at the front and rear combine to rotatably support the outer circumferential surface of tape reels TR. Retainer shaft 75 pushes on an upper section of the outer circumferential surface of a tape reel TR that rises up, such that the tape reel TR does not come out of the holding section due to the tension of carrier tape CT being pulled from tape reel TR.

Note that, it is not necessary for five tape reels TR to be set, four or fewer may be set. Also, when setting four or fewer tape reels TR as additional reels, empty tape reels TR may be set so as to fill any gaps in the reel holding space.

Additional type reel holding device 7 is attached using recessed attachment sections 721 and 717 formed at two locations at the front and rear of the lower side of the two side plates 71. In detail, attachment member 72 is attached facing down towards the front of bottom section 715 of side plate 71. Front side recessed attachment section 721 with an opening facing downwards is formed on the lower side of attachment member 72. Also, rear side recessed attachment section 717 with an opening facing downwards is formed on second bottom section 716 of side plate 71. The openings of front side recessed attachment section 721 and rear side recessed attachment section 717 get gradually wider towards the lower side.

On the other hand, two round rod-shaped attachment seats that extend in the X-axis direction are additionally provided on standard reel holding section 35. In detail, arm extension member 37 that extends forwards is respectively provided on the front end of each of the two arm members 33. Front side rod-shaped attachment seat 38 is additionally provided connecting the front upper sections of the two arm extension members 37 spaced out in the X-axis direction. Also, rear rod-shaped attachment seat 39 is additionally provided connecting the front ends on the two side plates 351 of standard reel holding section 35 spaced out in the X-axis direction.

Additional type reel holding device 7 is attached by being loaded onto front side rod-shaped attachment seat 38 and rear side rod-shaped attachment seat 39 from above. Front side recessed attachment section 721 engages from above with front side rod-shaped attachment seat 38, and rear side recessed attachment section 717 engages from above with rear side rod-shaped attachment seat 39. Thus, adding additional type reel holding device 7 is performed by simply loading it, which is extremely easy.

The position of additional type reel holding device 7 is decided in the front-rear direction (Y-axis direction) by engagement at four locations. Also, rear end section 713 of side plate 71 of additional type reel holding device 7 is inserted between adjacent dividing plates 352 of standard reel holding sections 35 or between dividing plate 352 and side plate 351. Thus, movement of additional type reel holding device 7 is restricted in the X-axis direction.

3. Effects of Additional Type Reel Holding Device 7

According to the above configuration, standard reel holding section 35 can hold 40 tape reels TR, and seven additional type reel holding devices 7 can hold a total of thirty-five tape reels TR. Thus, the overall quantity of carrier tapes CT that can be supplied by feeder devices 81 and 82 is increased from forty to seventy-five after additional type reel holding device 7 is attached. Note that, additional type reel holding device 7 is arranged further away from feeder devices 81 and 82 than standard reel holding section 35, therefore there is no problem even if carrier tape CT is supplied in a slightly diagonal direction.

According to an embodiment above, even in a case in which it is necessary to supply a larger quantity of carrier tapes CT than conventionally due to new type feeder devices being loaded on feeder attachment section 32, there is no shortage in the overall quantity of carrier tapes CT that can be supplied. For example, even in a case in which thirty-five auto loading feeder devices 82 and multiple feeder devices 35 that require two tape reels TR per slot, and five conventional feeder devices 81 are loaded, the overall quantity of carrier tapes CT that can be supplied is sufficient.

Also, the quantity of additional type reel holding devices 7 arranged lined up in the X-axis direction can be freely selected from the single device shown in FIG. 5 to the seven devices shown in FIG. 3. Further, as shown by arrow M in FIG. 5, the attachment position of additional type reel holding device 7 can be changed to any desired position in the X-axis direction. That is, the quantity and attachment positions of additional type reel holding device 7 can be freely changed to match the types, attachment quantities, arrangement states, and so on of feeder devices 81 and 82.

In the example in FIG. 3, auto loading feeder device 82 uses a first carrier tape CT supplied from a tape reel TR loaded in standard reel holding section 35. Also, auto loading feeder device 82 holds the leading end of a second carrier tape CT supplied from a tape reel TR loaded in additional type reel holding device 7, such that preparation of the next carrier tape to use is complete. In other words, the additional tape reel TR loaded in additional type reel holding device 7 is used after the tape reel TR held by standard reel holding section 35.

The first and second carrier tapes CT are fed diagonally upwards from the respective tape reels TR and inserted into a tape insertion opening at the front of auto loading feeder device 82. The first and second carrier tapes CT are separated by a large distance in the vertical direction at a position close to tape reels TR, and gradually get closer together as they approach auto loading feeder device 82. Accordingly, the first and second carrier tapes CT do not get entangled along their respective feeding routes.

With auto loading feeder device 82, when the first carrier tape CT runs out, the second carrier tape CT is pulled from the tape reel TR loaded on additional type reel holding device 7. At a convenient time, an operator removes the empty tape reel TR that held first carrier tape CT for which supply is complete from standard reel holding section 35. This frees up a reel holding position on standard reel holding section 35.

Next, the operator moves the tape reel from which the second carrier tape CT is being pulled from additional type reel holding device 7 to the free reel holding position on standard reel holding section 35. Further, the operator sets a tape reel TR on which is wound a third carrier tape CT holding the same type of component to the empty reel holding section of additional type reel holding device 7. Then, the operator pulls the leading end of the third carrier tape CT and inserts it into auto loading feeder device 82. The above tape reel TR exchange work can be performed while component mounter 1 is operating. Thus, with auto loading feeder device 82, component supply is uninterrupted even without performing splicing.

Also, a multiple feeder device loaded on feeder attachment section 32 can be used at the same time as a tape reel TR loaded on standard reel holding section 35 and an additional tape reel TR loaded on additional type reel holding device 7. In this case too, splicing work can be performed at standard reel holding section 35 and additional type reel holding device 7 while component mounter 1 is operating. Thus, a multiple feeder device can alternately supply two types of components by feeding and rewinding two carrier tapes CT supplied from two tape reels TR. Also, with a multiple feeder device too, similar to the case of auto loading feeder device 82, the supply routes of the first and second carrier tapes do not get entangled.

4. Form and Effects of Additional Type Reel Holding Device 7

The embodiment additional type reel holding device 7 is configured to be attached to component supply device 3 provided on component mounter 1, component supply device 3 including multiple feeder devices 81 and 82 configured to sequentially supply multiple components by feeding carrier tape CT in which the multiple components are held and standard reel holding section 35 configured to hold multiple tape reels TR around which are wound the carrier tapes CT in a rotatable and exchangeable manner, wherein additional type reel holding device 7 is attached as an addition to standard reel holding section 35, holds additional tape reels TR different to the tape reels TR held by standard reel holding section 35 in a rotatable and exchangeable manner, and supplies the carrier tapes CT wound on the additional tape reels TR to feeder devices 81 and 82.

The embodiment additional type reel holding device 7, in a case in which a quantity of carrier tapes CT supplied from standard reel holding section 35 provided on component supply device 3 is insufficient, may be attached as an addition to component supply device 3, may hold an additional tape reel TR, and may supply carrier tape CT from the additional tape reel TR to feeder device 82. Thus, it is possible to increase the overall quantity of carrier tapes CT supplied to feeder devices 81 and 82 from standard reel holding section 35 and additional type reel holding device 7.

Further, modifications to component mounter 1 are not required, and the current standard reel holding section 35 can be used. Thus, compared to conventional technology of manufacturing an entirely new reel holding section to exchange with the current one, additional type reel holding device 7 is compact, has good usability, and curtails increases in costs.

Further, additional type reel holding device 7 can be used regardless of the type or construction of feeder devices 81 and 82, therefore exhibits excellent compatibility and versatility.

Also, the embodiment additional type reel holding device 7 is provided with recessed attachment sections 721 and 717 with a downwards opening that engages from above with rod-shaped attachment seats 38 and 39 that extend in the X-axis direction (an engagement direction in which the multiple feeder devices are arranged). Thus, additional type reel holding device 7 can be attached extremely easily.

Also, the attachment position of the embodiment additional type reel holding device 7 can be changed in the X-axis direction (the direction in which the multiple feeder devices are arranged). Accordingly, the attachment position of additional type reeling holding device 7 can be freely changed to match the types, attachment quantities, arrangement states, and so on of feeder devices 81 and 82, meaning additional type reeling holding device 7 can be applied widely and easily.

Further, the embodiment additional type reel holding device 7 holds a quantity of tape reels TR that is fewer than the quantity of feeder devices 81 and 82, and multiple additional type reel holding devices 7 can be arranged in the X-axis direction (the direction in which the multiple feeder devices are arranged). Accordingly, the quantity of additional type reeling holding device 7 can be freely changed to match the types, attachment quantities, arrangement states, and so on of feeder devices 81 and 82, meaning additional type reeling holding device 7 can be applied widely and easily.

Also, the embodiment additional type reel holding device 7 is attached on the front side of standard reel holding section 35 separated from feeder devices 81 and 82. Accordingly, there is no problem even if carrier tape CT is supplied in a slightly diagonal direction from additional type reel holding device 7. Also, the two carrier tapes CT supplied from standard reel holding section 35 and additional type reel holding device 7 do not get entangled along their respective supply routes. Thus, operational reliability of component supply device 3 is good. Also, when using a multiple feeder device, an additional tape reel TR can be used at the same time as a tape reel TR loaded on standard reel holding section 35. And, when using auto loading feeder device 82, the additional tape reel TR is used after the tape reel loaded on standard reel holding section 35, and when the tape reel loaded on standard reel holding section 35 is removed to create a free reel holding position, the additional tape reel TR is moved to the free reel holding position.

Accordingly, additional type reel holding device 7 has excellent usability, with exchange work of tape reels TR and splicing work of carrier tapes CT being allowed while component mounter 1 is operating.

5. Applications and Alternative Embodiments

Note that, the quantity of additional tape reels TR loaded on additional type reel holding device 7 is not limited to five, and may be selected from the range of one to forty to match the quantity of slots 322. Also, a tape guide that acts as a guide for the supply route may be added as appropriate to enable smooth supply of carrier tape CT from additional type reel holding device 7. Various other applications and modifications are possible for the present disclosure.

REFERENCE SIGNS LIST

1: component mounter; 3: component supply device; 31: feeder pallet; 32: feeder attachment section; 35: standard reel holding section; 38: front side rod-shaped attachment seat; 39: rear side rod-shaped attachment seat; 7: additional type reel holding device; 71: side plate; 717: rear side recessed attachment section; 72: attachment member; 721: front side recessed attachment section; 73: front bottom plate; 74: support shaft; 75: retainer shaft; 81: feeder device; 82: auto loading feeder device; TR: tape reel; CT: carrier tape☐

The invention claimed is:

1. A component supply device configured to supply components to a component mounter, comprising:
a standard reel holding section configured to hold standard tape reels around which are respectively wound standard carrier tape in a rotatable and exchangeable manner;
an additional reel holding device attached the standard reel holding section that holds additional tape reels different from the standard tape reels, an additional carrier tape being respectively wound around the additional tape reels in a rotatable and exchangeable manner; and feeder devices configured to sequentially supply the components by feeding the standard carrier tape and the additional carrier tape in which the components are held.

2. The component supply device according to claim 1, wherein
a recessed attachment section is provided on the standard reel holding section and configured with a downwards opening that engages from above with a rod-shaped attachment seat that extends in an arrangement direction of the feeder devices.

3. The component supply device according to claim 2, wherein
an attachment position of the additional reel holding device is changeable in the arrangement direction.

4. The component supply device according to claim 1, wherein
the additional reel holding device is configured to hold a quantity of the additional tape reels smaller than a quantity of the feeder devices, and multiple of the additional reel holding device are arrangeable in an arrangement direction.

5. The component supply device according to claim 1, wherein
the additional reel holding device is configured to be attached to a side of the standard reel holding section away from the feeder devices.

6. The component supply device according to claim 1, wherein
the component supply device supplies components to the component mounter from one of the additional tape reels and one of the standard tape reels at a same time.

7. The component supply device according to claim 1, wherein
the component supply device supplies components to the component mounter from one of the additional tape reels which moved to a free reel holding position when one of the standard tape reels is removed from the standard reel holding section.

* * * * *